United States Patent
Kim (10) Patent No.: US 8,187,969 B2
(45) Date of Patent: May 29, 2012

(54) METHOD FOR MANUFACTURING SEMICONDUCTOR DEVICE

(75) Inventor: Hyung Hwan Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 143 days.

(21) Appl. No.: 12/641,577

(22) Filed: Dec. 18, 2009

(65) Prior Publication Data

US 2010/0330792 A1 Dec. 30, 2010

(30) Foreign Application Priority Data

Jun. 24, 2009 (KR) .................. 10-2009-0056618

(51) Int. Cl.
*H01L 21/4763* (2006.01)

(52) U.S. Cl. ........ 438/637; 438/233; 438/586; 438/592; 438/672; 438/721; 257/E21.307; 257/E21.577; 257/E21.585

(58) Field of Classification Search ............... 438/233, 438/672, 721, 586, 592, 637; 257/E21.307, 257/E21.577, E21.585
See application file for complete search history.

(56) References Cited

U.S. PATENT DOCUMENTS

| | | | | |
|---|---|---|---|---|
| 5,134,083 A | * | 7/1992 | Matthews | 438/233 |
| 5,637,525 A | * | 6/1997 | Dennison | 438/233 |
| 5,718,800 A | * | 2/1998 | Juengling | 438/586 |
| 5,811,329 A | * | 9/1998 | Ahmad et al. | 438/233 |
| 6,858,452 B2 | * | 2/2005 | Park et al. | 438/14 |
| 6,939,764 B2 | * | 9/2005 | Chen et al. | 438/258 |
| 6,995,056 B2 | * | 2/2006 | Lee et al. | 438/233 |
| 7,119,015 B2 | * | 10/2006 | Park et al. | 438/672 |
| 7,229,904 B2 | * | 6/2007 | Kim | 438/586 |
| 7,476,613 B2 | * | 1/2009 | Kim | 438/637 |
| 2005/0142824 A1 | * | 6/2005 | Kim | 438/586 |
| 2006/0105569 A1 | * | 5/2006 | Kim | 438/675 |
| 2007/0275555 A1 | * | 11/2007 | Kim | 438/637 |

FOREIGN PATENT DOCUMENTS

| | | |
|---|---|---|
| KR | 2000-0033199 A | 6/2000 |
| KR | 2008-0084064 A | 9/2008 |
| KR | 2008-0088909 A | 10/2008 |

* cited by examiner

*Primary Examiner* — Zandra Smith
*Assistant Examiner* — Toniae Thomas
(74) *Attorney, Agent, or Firm* — Ladas & Parry LLP

(57) ABSTRACT

A method for manufacturing a semiconductor device includes the steps of forming conductive patterns on a substrate; forming an interlayer dielectric between the conductive patterns; defining contact holes in the interlayer dielectric to expose portions of the substrate between the conductive patterns; forming a first conductive layer on a surface including the contact holes; forming contact plugs in such a way as to be isolated in the respective contact holes, by etching a surface of the first conductive layer to expose upper end surfaces of the conductive patterns; etching a partial thickness of the conductive patterns so that the upper end surfaces of the conductive patterns are lower than an upper end surface of the interlayer dielectric; and forming an insulation layer on the resultant structure.

20 Claims, 8 Drawing Sheets

METHOD FOR MANUFACTURING SEMICONDUCTOR DEVICE

CROSS-REFERENCE TO RELATED APPLICATIONS

The present application claims priority to Korean patent application number 10-2009-56618 filed on Jun. 24, 2009, which is incorporated herein by reference in its entirety.

BACKGROUND OF THE INVENTION

The present invention relates generally to semiconductor technology, and more particularly, to a method for manufacturing a semiconductor device.

Due to high integration of semiconductor devices, the distance between conductive lines such as word lines has decreased; and therefore, the margin of a contact process has been reduced. In order to secure the margin of a contact process, a self-aligned contact (SAC) process is employed.

FIGS. 1A through 1H are cross-sectional views illustrating the processes, including an SAC process, of a conventional method for manufacturing a semiconductor device.

Figure 1A:
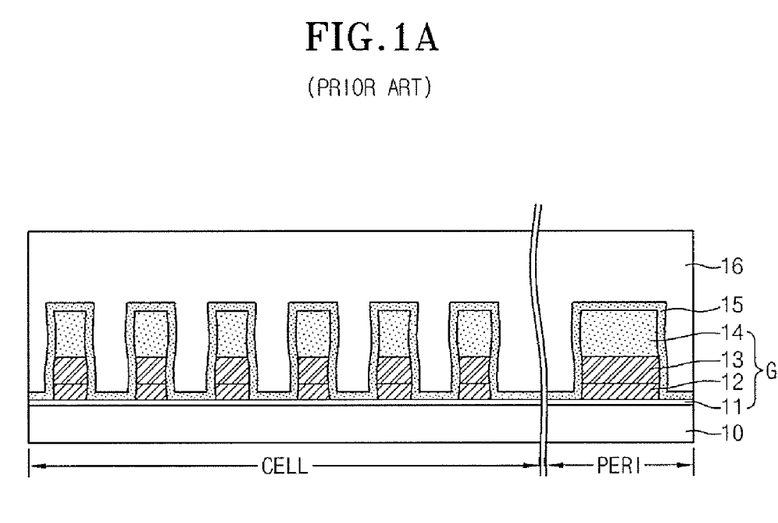
FIGS. 1A through 1H are cross-sectional views shown for illustrating the processes of a conventional method for manufacturing a semiconductor device.

Referring to FIG. 1A, a gate insulation layer 11, a first polysilicon layer 12, a tungsten layer 13 and a hard mask nitride layer 14 are stacked on a substrate 10 which has a cell region CELL and a peripheral region PERI. Gates G are formed by patterning the hard mask nitride layer 14, the tungsten layer 13 and the first polysilicon layer 12 through a photolithographic process.

Next, a capping nitride layer 15 is formed along the profile of the entire surface including the gates G. An oxide-based first interlayer dielectric 16 is formed on the capping nitride layer 15.

Figure 1B:
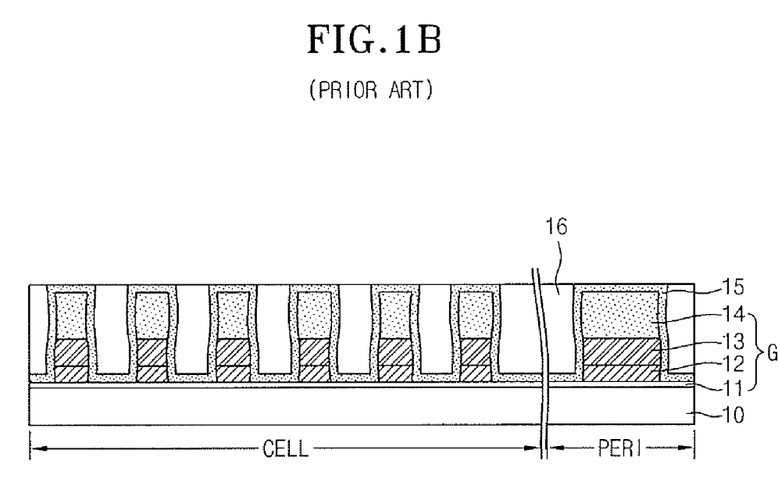

Referring to FIG. 1B, the first interlayer dielectric 16 is CMPed (chemically mechanically polished) using an HSS (high selectivity slurry) having high etching selectivity of a nitride layer with respect to an oxide layer, such that portions of the capping nitride layer 15 on top of the gates G are exposed.

Figure 1C:
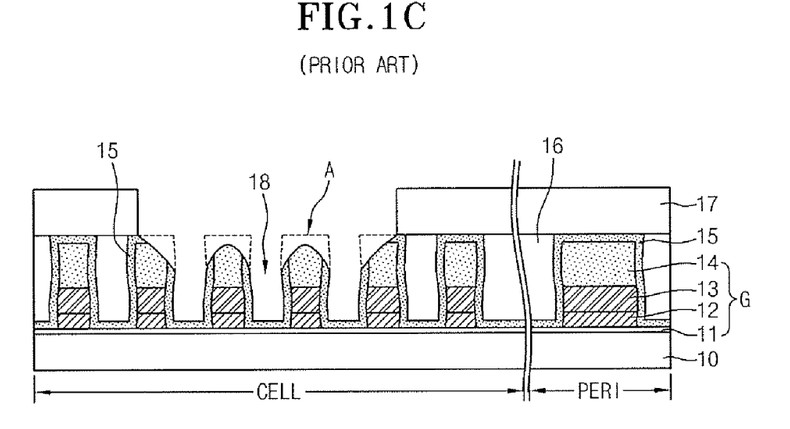

Referring to FIG. 1C, a mask pattern 17 is formed with an opening over a landing plug contact area, and landing plug contact holes 18 are defined by etching portions of the first interlayer dielectric 16 between the gates G using the mask pattern 17 as an etch mask.

At this time, in order to etch the first interlayer dielectric 16 formed between the gates G and having a substantial thickness, over-etching should be conducted. During the over-etching, top corner portions A of the hard mask nitride layer 14 are lost, so the hard mask nitride layer 14 has a non-uniform profile.

Figure 1D:
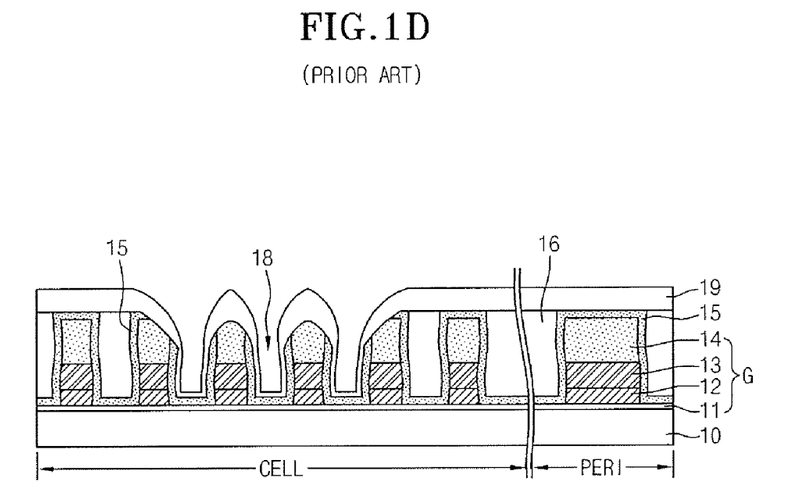

Referring to FIG. 1D, the mask pattern 17 is removed, and a buffer oxide layer 19 is formed on the entire surface.

The buffer oxide layer 19 is formed to a large thickness on both the gates G and the first interlayer dielectric 16, and is formed to a relatively small thickness on the bottoms of the landing plug contact holes 18.

The buffer oxide layer 19 functions to prevent the hard mask nitride layer 14 from being lost when subsequently conducting a process for removing portions of the capping nitride layer 15.

Figure 1E:
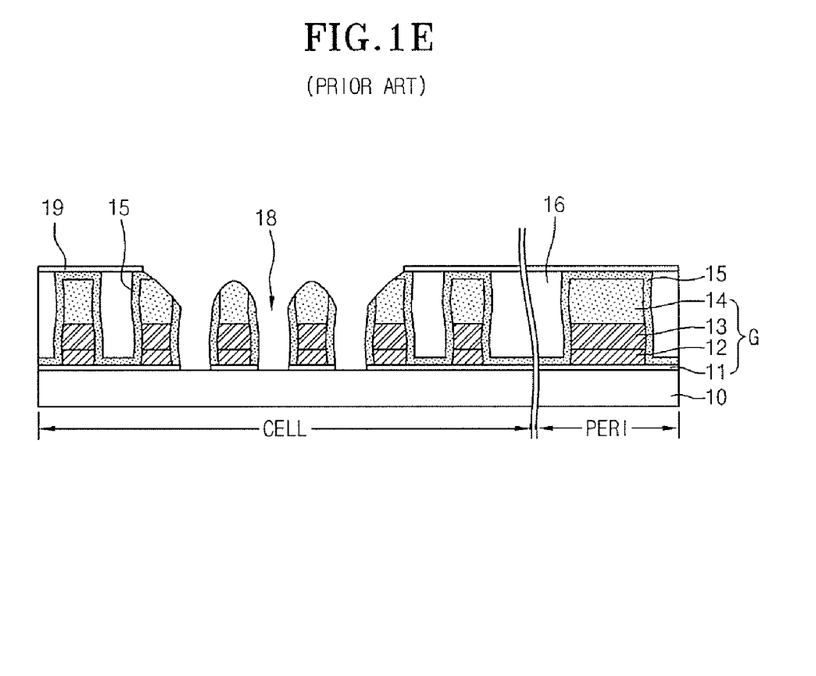

Referring to FIG. 1E, an entire surface etching process is conducted during which portions of the buffer oxide layer 19, the capping nitride layer 15, and the gate insulation layer 11 present on the bottoms of the landing plug contact holes 18 are removed to expose portions of the substrate 10.

While conducting the entire surface etching process, loss of the first interlayer dielectric 16 and the hard mask nitride layer 14 is prevented by the buffer oxide layer 19 which is formed on the gates G and the first interlayer dielectric 16 to a relatively large thickness.

Figure 1F:
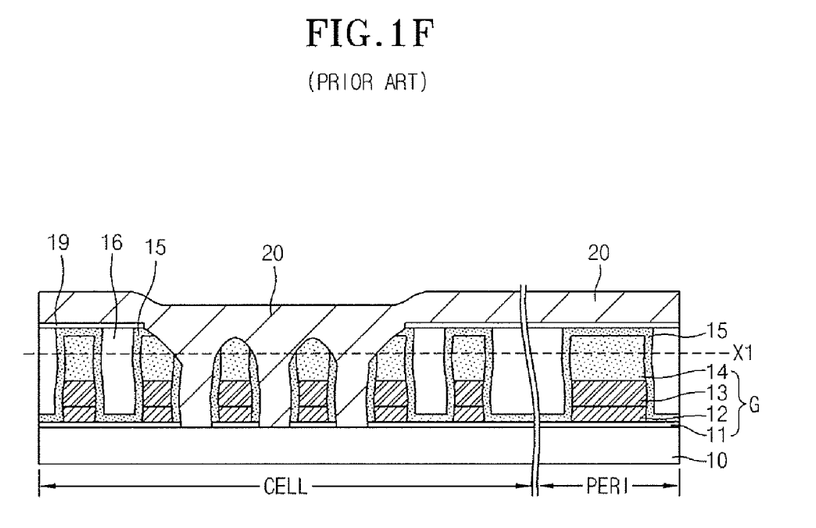

Referring to FIG. 1F, the landing plug contact holes 18 are filled by forming a second polysilicon layer 20 on the entire surface of the resultant substrate 10.

Figure 1G:
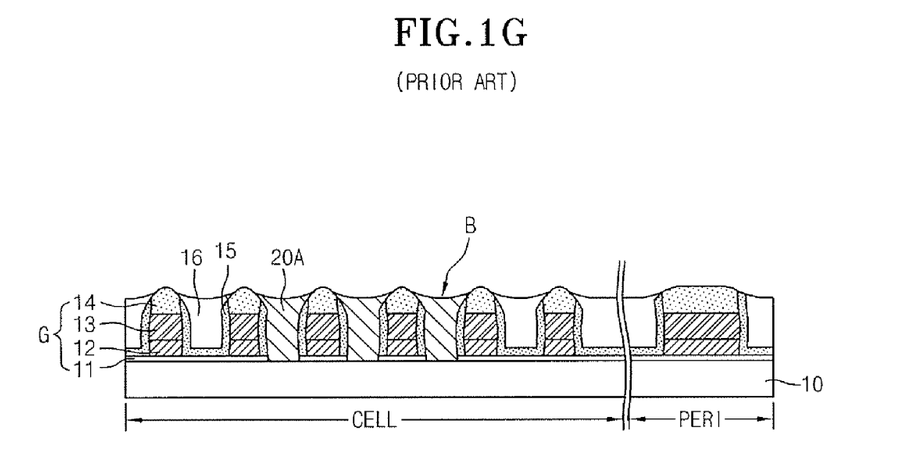

Referring to FIG. 1G, by CMPing (chemically mechanically polishing) the second polysilicon layer 20, landing plug contacts 20A are formed in such a way as to be isolated in their respective landing plug contact holes 18.

At this time, in order to prevent an unwanted short caused by bridging of adjacent landing plug contacts 20A, the CMP is conducted to the height X1 (see FIG. 1F) so that portions of the hard mask nitride layer 14 which constitute the non-uniform profiles are substantially removed.

Figure 1H:
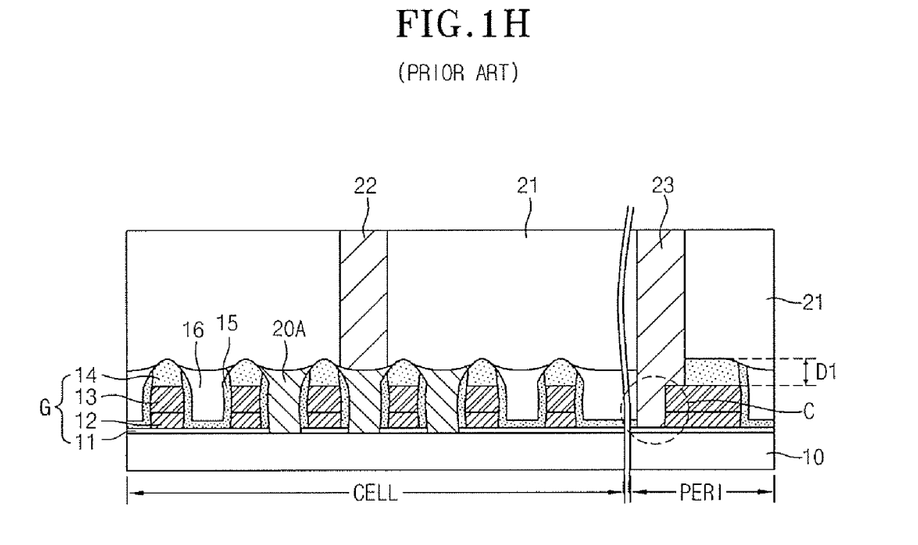

Referring to FIG. 1H, a second interlayer dielectric 21 is formed on the entire surface including the landing plug contacts 20A. Then, by patterning the second interlayer dielectric 21 in both the cell region CELL and the peripheral region PERI and the hard mask nitride layer 14 in the peripheral region PERI through a photolithographic process, a first contact hole, which exposes the landing plug contact 20A in the cell region CELL, and a second contact hole, which exposes the tungsten layer 13 in the peripheral region PERI, are defined. Thereafter, by filling a conductive layer in the first and second contact holes, a first contact plug 22, which is electrically connected to the substrate 10 in the cell region CELL, and a second contact plug 23, which is electrically connected to the tungsten layer 13 of the gate G formed in the peripheral region PERI, are formed.

The conventional method for manufacturing a semiconductor device has problems as described below.

First, the hard mask nitride layer 14 should be formed sufficiently thick in consideration of the thickness of the hard mask nitride layer 14 that will be lost when conducting the etching process for defining the landing plug contact holes 18 (see FIG. 1C) and the CMP process for forming the landing plug contacts 20A (see FIG. 1G). When the hard mask nitride layer 14 is formed thick, the aspect ratio of the gates G increases making it difficult to control the etch profile when etching the gates G. As a consequence, defects such as leaning of the gates G occur, and the line width of the gates G becomes non-uniform, whereby the resistance of the individual gates G vary depending upon the position of the gate G in a wafer, making it impossible to secure uniform characteristics of a semiconductor device.

Second, since the aspect ratio of the individual gates G increases, voids are likely to be produced in the first interlayer dielectric 16 which is filled between gates G in the cell region CELL in which a gap between the gates G is narrow. The second polysilicon layer 20 may then fill in the voids and cause a defect in which an adjacent landing plug contact 20A is short-circuited.

Third, in order to ensure that polishing is stopped at the position of the capping nitride layer 15 when conducting the CMPing process for the first interlayer dielectric 16 (see FIG. 1B), the HSS having high etching selectivity of a nitride layer with respect to an oxide layer should be used. In this regard, since the HSS is expensive in that it contains a ceria-based abrasive and a number of additives, the manufacturing cost of the semiconductor device increases.

Fourth, when conducting the CMP process for forming the landing plug contacts 20A (see FIG. 1G), in order to prevent adjacent landing plug contacts 20A from being bridged, the CMP process should be conducted to height X1 (see FIG. 1F)

so as to remove the portions of the hard mask nitride layer 14 having non-uniform profiles. For this purpose, the hard mask nitride layer 14, the first interlayer dielectric 16 and the second polysilicon layer 20, which have different polishing rates, should be simultaneously polished. In this regard, as materials having different polishing rates are simultaneously polished, the process burden increases. Further, due to the differences in polishing rates among the materials to be polished, defects, such as dishing (see part B of FIG. 1G) in which the first interlayer dielectric 16 and the landing plug contacts 20A subside below the surface of the hard mask nitride layer 14, are likely to occur.

Fifth, since the thickness D1 of the hard mask nitride layer 14 in the peripheral region PERI is substantial, when conducting the etching process for defining the first and second contact holes (see FIG. 1H), the process burden increases due to a substantial difference in thickness between the layers to be etched in the cell region CELL and those in the peripheral region PERI.

Sixth, when defining the second contact hole in the peripheral region PERI (see FIG. 1H), if misalignment occurs between the second contact hole and the gate G, while the hard mask nitride layer 14 having the substantial thickness is etched, the first interlayer dielectric 16 on the side surface of the gate G is also etched causing a portion of the substrate 10 at a side of the gate G to be exposed directly below the second contact hole. Thus, as shown in the part C of FIG. 1H, defects are caused in that the second contact plug 23 filled in the second contact hole and the substrate 10 are likely to be short-circuited.

BRIEF SUMMARY OF THE INVENTION

Embodiments of the present invention include a method for manufacturing a semiconductor device which is suitable for increasing the margin of a self-aligned contact process.

In one embodiment of the present invention, a method for manufacturing a semiconductor device comprises the steps of forming conductive patterns on a substrate; forming an interlayer dielectric between the conductive patterns; defining contact holes through the interlayer dielectric to expose portions of the substrate between the conductive patterns; forming a first conductive layer on a surface including the contact holes; forming contact plugs in such a way as to be isolated in the respective contact holes, by etching the surface of the first conductive layer to expose upper end surfaces of the conductive patterns; etching a partial thickness of the conductive patterns so that the upper end surfaces of the conductive patterns are lower than an upper end surface of the interlayer dielectric; and forming an insulation layer on a resultant structure.

The conductive patterns may comprise gate electrodes.

The conductive patterns may be formed as a second conductive layer which includes at least any one of tungsten, a tungsten silicide and cobalt or may be formed by stacking a polysilicon layer and the second conductive layer.

The second conductive layer may be formed to a thickness of 700~2,000 Å.

The conductive patterns may be formed as a second conductive layer which includes at least any one of tungsten, a tungsten silicide and cobalt or may be formed by stacking a polysilicon layer and the second conductive layer, and the first conductive layer may be formed of a conductive material that has etching selectivity different from that of the second conductive layer.

The first conductive layer may comprise a polysilicon layer.

The step of etching the partial thickness of the conductive patterns may be implemented such that an etched thickness of the conductive patterns is in the range of 400~1,000 Å.

The step of forming the insulation layer may be implemented until spaces, which are defined by etching the partial thickness of the conductive patterns, are completely filled.

The insulation layer may comprise a nitride layer.

In another embodiment of the present invention, a method for manufacturing a semiconductor device comprises the steps of forming conductive patterns on a substrate which has a first region and a second region, where a conductive pattern in the second region has a line width greater than a conductive pattern in the first region; forming a first interlayer dielectric between the conductive patterns; defining first contact holes through the first interlayer dielectric to expose portions of the substrate between the conductive patterns in the first region; forming a first conductive layer on a surface including the first contact holes; forming first contact plugs in such a way as to be isolated in the respective first contact holes, by etching the surface of the first conductive layer to expose upper end surfaces of the conductive patterns; etching a partial thickness of the conductive patterns so that the upper end surfaces of the conductive patterns are lower than an upper end surface of the first interlayer dielectric; and forming an insulation layer on a resultant surface such that the insulation layer completely fills spaces, which are defined by etching the partial thickness of the conductive patterns in the first region, and is formed along a surface topology in the second region.

The first region may include a cell region and the second region includes a peripheral region.

The conductive patterns may comprise gate electrodes.

The conductive patterns may be formed as a second conductive layer which includes at least any one of tungsten, a tungsten silicide and cobalt or may be formed by stacking a polysilicon layer and the second conductive layer.

The second conductive layer may be formed to a thickness of 700~2,000 Å.

The conductive patterns may be formed as a second conductive layer which includes at least any one of tungsten, a tungsten silicide and cobalt or may be formed by stacking a polysilicon layer and the second conductive layer, and the first conductive layer may be formed of a conductive material that has etching selectivity different from that of the second conductive layer.

The first conductive layer may comprise a polysilicon layer.

The step of etching the partial thickness of the conductive patterns may be implemented such that an etched thickness of the conductive patterns is in the range of 400~1,000 Å.

The insulation layer may comprise a nitride layer.

After the step of forming the insulation layer, the method may further comprise the steps of forming a second interlayer dielectric on the insulation layer; patterning the second interlayer dielectric and the insulation layer in the first region and the second region and thereby defining a second contact hole, which exposes the first contact plug of the first region, and a third contact hole, which exposes the conductive pattern of the second region; and filling a conductive material in the second contact hole and the third contact hole and thereby forming second and third contact plugs.

DESCRIPTION OF SPECIFIC EMBODIMENT

In an embodiment of the present invention, when conducting an etching process for defining landing plug contact holes and a CMP process, a conductive layer having high etching selectivity with respect to an oxide layer is used as an etch barrier. Due to this fact, the etching away of portions of gates occurring during these processes can be reduced allowing the height at which the gates are formed to be decreased since it is not necessary for the gates to be formed at an increased height necessary to compensate for the partial loss of the gates during etching.

Because the height of the gates can be decreased, when etching the gates, it is easy to control the etch profile and the gates can be etched vertically. Therefore, defects such as leaning of the gates are prevented, and the gates can be formed to have a uniform line width, whereby the uniformity of the characteristics of a semiconductor device can be improved.

Also, because the height of the gates can be decreased, generation of voids is suppressed when forming an interlayer dielectric between the gates. Thus, defects due to the presence of the voids can be prevented, and the manufacturing yield of the semiconductor device can be increased.

Further, in a CMP process that is conducted for the interlayer dielectric after the gates are formed, a cheap slurry for an oxide layer can be used instead of an expensive HSS (high selectivity slurry), whereby costs can be saved.

Moreover, when defining the landing plug contact holes, since the upper portions of the gates are not substantially lost, a process for forming a buffer oxide layer can be omitted, whereby the number of processes can be decreased and the manufacturing cost of the semiconductor device can be reduced.

In addition, the upper portions of the gates can have uniform profiles in an embodiment of the present invention. Therefore, when conducting a CMP process for forming landing plug contacts, it is not necessary to polish various different material layers, and it is sufficient to polish only a polysilicon layer, whereby process burden can be lessened.

When conducting the CMP process for forming the landing plug contacts, since only the polysilicon layer is polished, defects such as dishing can be prevented.

Furthermore, when conducting an etching process for defining first and second contact holes in a cell region and a peripheral region, respectively; since the thicknesses of layers to be etched in the cell region and the peripheral region are uniform, the process burden can be lessened.

Additionally, in an embodiment of the present invention a hard mask nitride layer is formed not only on the gates but also on the interlayer dielectric formed on both sides of the gates. Thus, even if a misalignment occurs between the second contact hole and the gate when defining the second contact hole in the peripheral region, the interlayer dielectric is prevented from being etched due to the presence of the hard mask nitride layer, whereby it is possible to prevent the occurrence of defects such as a short-circuit between a substrate and a contact plug filled in the second contact hole.

Hereafter, a specific embodiment of the present invention will be described in detail with reference to the accompanying drawings.

It is understood herein that the drawings are not necessarily to scale and in some instances proportions may have been exaggerated in order to more clearly depict certain features of the invention.

FIGS. 2A through 2H are cross-sectional views shown for illustrating the processes of a method for manufacturing a semiconductor device in accordance with an embodiment of the present invention.

Figure 2A:
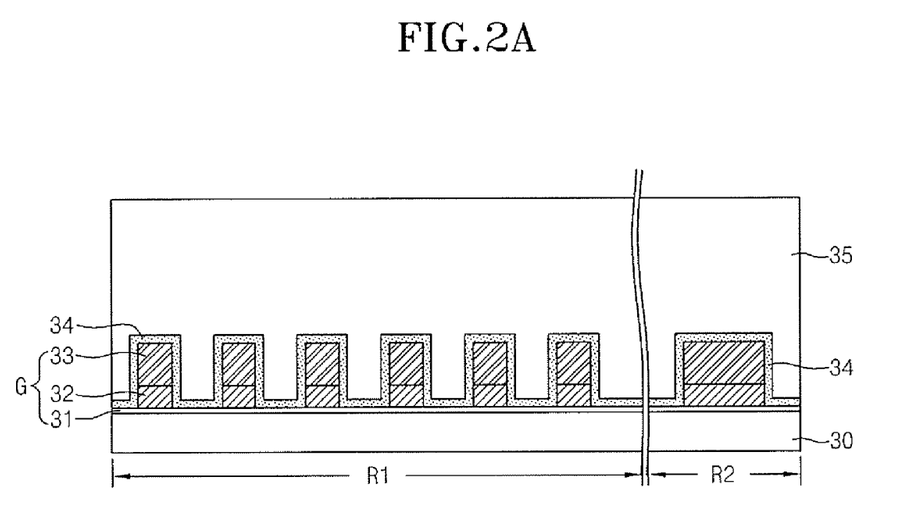
FIGS. 2A through 2H are cross-sectional views shown for illustrating the processes of a method for manufacturing a semiconductor device in accordance with an embodiment of the present invention.

Referring to FIG. 2A, a gate insulation layer 31, a polysilicon layer 32 and a first conductive layer 33 are stacked in a first region R1 and a second region R2 of a substrate 30. Then, by patterning the first conductive layer 33 and the polysilicon layer 32 through a photolithographic process, gates G are formed in the first region R1 and the second region R2.

In an embodiment, the first region R1 includes a cell region and the second region R2 includes a peripheral region.

Examples of materials suitable for use as the first conductive layer include any one of tungsten (W), a tungsten silicide ($WSi_x$) and cobalt (Co). In an embodiment, the thickness of the first conductive layer 33 can have a range of 700~2,000 Å.

In an embodiment, the gates G formed in the first region R1 have small line and space widths, and the gates G formed in the second region have relatively large line and space widths.

While it is illustrated in the embodiment shown in FIGS. 2A-2H that gate electrodes are formed by stacking the polysilicon layer 32 and the first conductive layer 33, it is conceivable that the gate electrodes can be formed differently including by only forming the first conductive layer 33.

Next, a capping layer 34 is formed along the profile of the entire surface including the gates G. A first interlayer dielectric 35 is formed on the capping layer 34.

In an embodiment, the capping layer 34 can be formed using a nitride-based material, and the first interlayer dielectric 35 can be formed using an oxide-based material.

The first interlayer dielectric 35 is formed sufficiently thick so as to fill the spaces between the gates G and to have a predetermined thickness above the gates G.

Figure 2B:
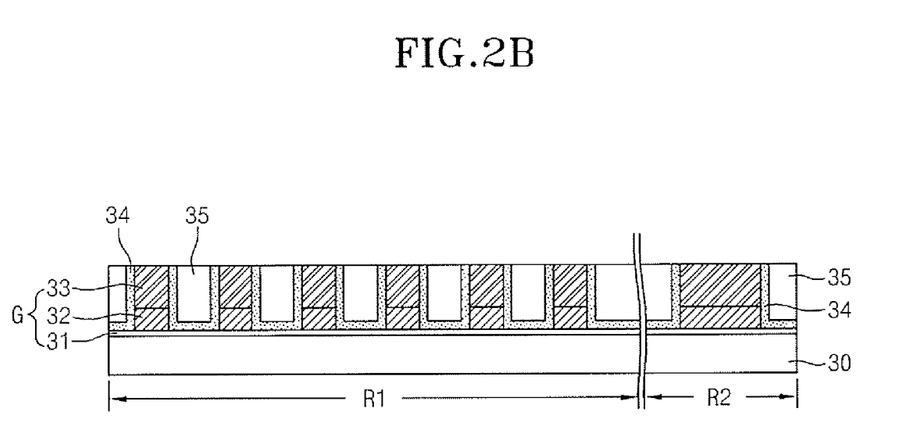

Referring to FIG. 2B, by entire-surface etching the first interlayer dielectric 35 and the capping layer 34 until the first conductive layer 33 is exposed, portions of the first interlayer dielectric 35 remain between the gates G.

A CMP process can be used as the entire surface etching process.

In an embodiment, the first interlayer dielectric 35 is formed of an oxide-based material and the first conductive layer 33 is formed of a material such as tungsten (W), a tungsten silicide ($WSi_x$) or cobalt (Co) so that the etching selectivity between the first interlayer dielectric 35 and the first conductive layer 33 is very high, for example, 100:1 or over. Therefore, a cheap slurry for etching an oxide layer can be used when conducting the CMP process, differently from the conventional art in which an expensive HSS should be used.

Figure 2C:
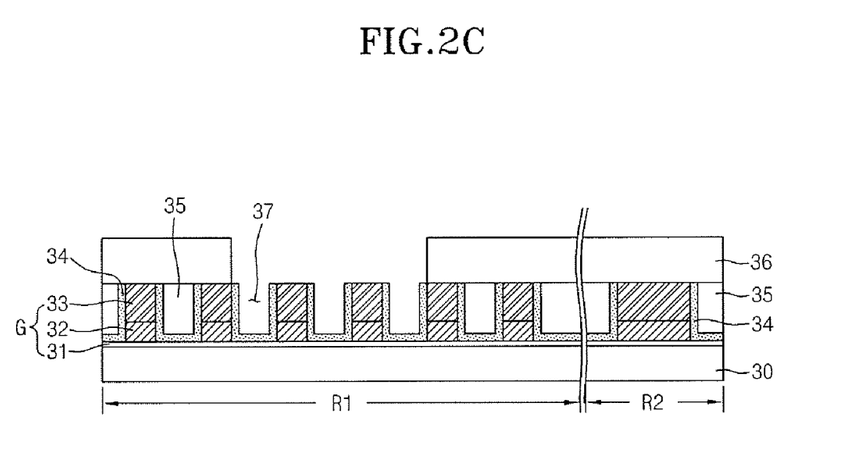

Referring to FIG. 2C, a mask pattern 36 is formed on the resultant structure having and opening over a landing plug contact area of the first region R1. By etching the portions of the first interlayer dielectric 35 present between the gates G using the mask pattern 36 as an etch mask, landing plug contact holes 37 are defined.

As described above, the etching selectivity between the first interlayer dielectric 35 and the first conductive layer 33 according to an embodiment is high at 100:1 or over, and therefore the first conductive layer 33 is not substantially lost when etching the landing plug contact holes 37.

Figure 2D:
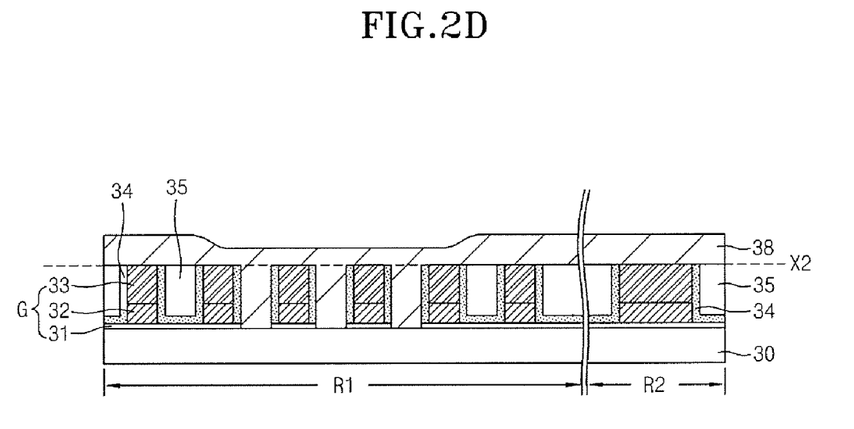

Referring to FIG. 2D, the mask pattern 36 is removed. Thereupon, by removing portions of the capping layer 34 and the gate insulation layer 31 present on the bottoms of the landing plug contact holes 37, portions of the substrate 30 are exposed in the first region R1.

Thereupon, a second conductive layer 38 is formed on the entire surface of the resultant structure in such a way as to fill the landing plug contact holes 37.

In an embodiment, the second conductive layer 38 is formed of a material having an etching selectivity different from that of the first conductive layer 33. For example, the second conductive layer 38 can be formed as a polysilicon layer.

Figure 2E:
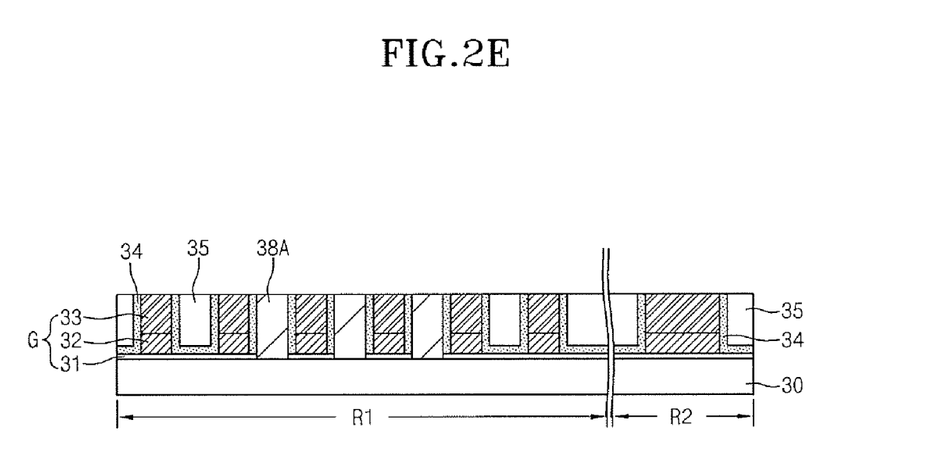

Referring to FIG. 2E, by entire-surface etching the second conductive layer 38 using the first conductive layer 33 as an etch stopper, landing plug contacts 38A are formed in such a way as to be isolated in their respective landing plug contact holes 37.

For example, a CMP process or an etch-back process can be used as the entire surface etching process.

At this time, the second conductive layer 38 is etched to the height X2 (see FIG. 2D).

Figure 2F:
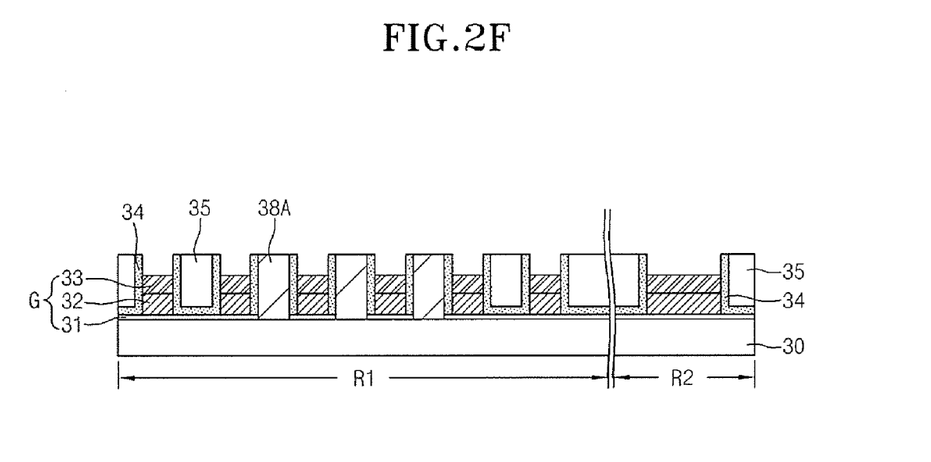

Referring to FIG. 2F, by removing a partial thickness of the exposed first conductive layer 33, the upper end surfaces of the gates G are recessed to be lower than the upper end surface of the first interlayer dielectric 35.

In an embodiment, the removed thickness of the first conductive layer 33 can have a range of 400~1,000 Å. In this case, the remaining thickness of the first conductive layer 33 can have a range of 300~1,000 Å.

Figure 2G:
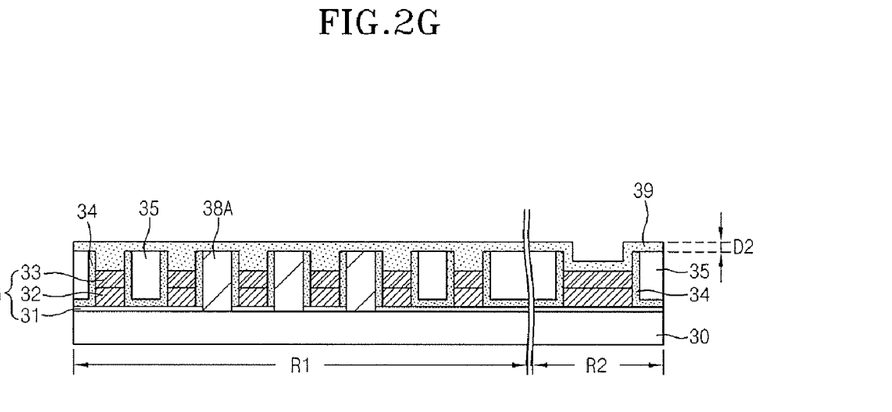

Referring to FIG. 2G, a hard mask layer 39 is formed on the entire surface of the resultant structure.

The hard mask layer 39 serves as a hard mask for protecting the gates G in a subsequent bit line contact process and a subsequent storage node contact process, and can be formed as a nitride layer.

For example, a furnace deposition method having excellent gapfill characteristics can be employed as a method for forming the hard mask layer 39.

The hard mask layer 39 is formed in the first region R1 having gates G with a small line width in such a way as to completely fill the spaces which are defined by removing the portions of the first conductive layer 33, and is formed along a surface topology in the second region R2 having the large line width of the gate G.

That is to say, in the second region R2, the space, which is defined by removing a portion of the first conductive layer 33, is not completely filled by the hard mask layer 39. Accordingly, the hard mask layer 39 in the second region R2 has a thickness D2 that is reduced when compared to the conventional art.

Figure 2H:
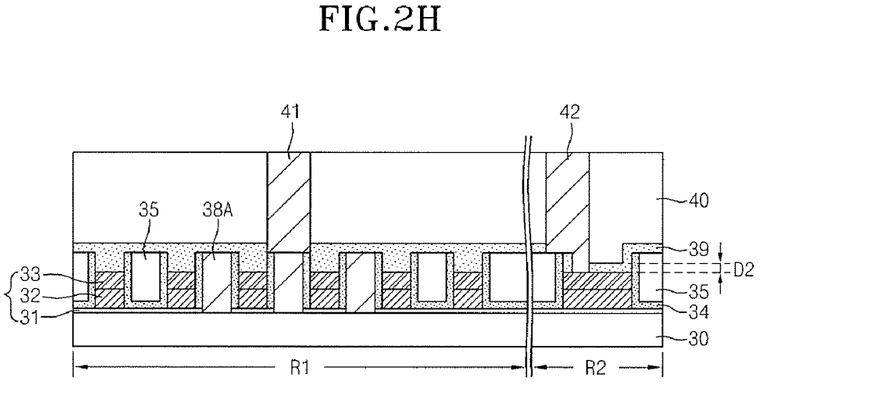

Referring to FIG. 2H, a second interlayer dielectric 40 is formed on the entire surface of the resultant structure. Thereafter, by patterning the second interlayer dielectric 40 and the hard mask layer 39 through a photolithographic process, a first contact hole and a second contact hole are defined in such a way as to expose the landing plug contact 38A in the first region R1 and the first conductive layer 33 in the second region R2, respectively.

Then, by filling a conductive layer in the first and second contact holes, a first contact plug 41 and a second contact plug 42 are formed in such a way as to be connected with the landing plug contact 38A of the first region R1 and the first conductive layer 33 of the second region R2, respectively.

As is apparent from the above description, in an embodiment of the present invention, when conducting the etching process for defining the landing plug contact holes 37 (see FIG. 2C) and the entire surface etching process (see FIGS. 2B and 2E), since loss of the gates G can be significantly reduced, the height of the gates G can be considerably decreased when compared to the conventional art as it is not necessary to increase the height to compensate for loss. As a result, when etching the gates G, it is easy to control the etch profile and the gates G can be etched vertically. Therefore, defects such as leaning of the gates G are prevented, and the gates G can be formed to have a uniform line width, whereby the uniformity of the characteristics of a semiconductor device can be improved. Also, generation of voids is suppressed when forming the first interlayer dielectric 35 between the gates G. Thus, defects due to the presence of the voids can be prevented, and the manufacturing yield of the semiconductor device can be increased.

Further, when CMPing the first interlayer dielectric 35 (see FIG. 2B), a cheap slurry for an oxide layer can be used instead of an expensive HSS, whereby costs can be saved.

Moreover, when defining the landing plug contact holes 37 (see FIG. 2C), since the upper portions of the gates G are not substantially lost, a process for forming a buffer oxide layer that should be otherwise conducted in the conventional art (see FIG. 1D) can be omitted. As a consequence, the number of processes can be decreased and the manufacturing cost of the semiconductor device can be reduced.

In addition, the upper portions of the gates G can have uniform profiles in an embodiment of the present invention. Therefore, when conducting the entire surface etching process for forming the landing plug contacts 38A (see FIG. 2E), it is not necessary to polish various different materials and it is sufficient to polish only the second conductive layer 38, whereby process burden can be lessened and defects such as dishing can be prevented.

Furthermore, when conducting the etching process for defining the first and second contact holes in the first region R1 and the second region R2, respectively (see FIG. 2H), since the thicknesses of the layers to be etched in the first region R1 and the second region R2 are the same, the process burden can be lessened. Additionally, in an embodiment of the present invention the hard mask layer 39 is formed not only on the gates G but also on the first interlayer dielectric 35 on both sides of the gates G. Thus, even if a misalignment occurs between the second contact plug 42 and the gate G in the second region R2, the first interlayer dielectric 35 is prevented from being etched due to the presence of the hard mask layer 39 formed on the first interlayer dielectric 35, whereby it is possible to prevent the occurrence of defects such as a short-circuit between the substrate 30 and the second contact plug 42.

Although specific embodiments of the present invention have been described for illustrative purposes, those skilled in the art will appreciate that various modifications, additions and substitutions are possible, without departing from the scope and the spirit of the invention as disclosed in the accompanying claims.

For example, while the aforementioned embodiments represent only the formation of the gates G and the landing plug contacts 38A self-aligned with the gates G, it is to be noted that the present invention is not limited thereto and can be applied when forming conductive patterns such as bit lines instead of the gates G.

In this case, the conductive patterns can comprise only the first conductive layer 33.

What is claimed is:
1. A method for manufacturing a semiconductor device, comprising the steps of:
   forming conductive patterns on a substrate;
   forming an interlayer dielectric between the conductive patterns;

defining contact holes in the interlayer dielectric to expose portions of the substrate between the conductive patterns;

forming a first conductive layer over surfaces of the conductive patterns such that the first conductive layer is formed within the contact holes;

etching the surface of the first conductive layer to expose upper end surfaces of the conductive patterns so as to form contact plugs isolated in the respective contact holes;

etching a partial thickness of the conductive patterns so that the upper end surfaces of the conductive patterns are lower than an upper end surface of the interlayer dielectric; and forming a hard mask layer on the resultant structure including the partially etched conductive patterns, wherein the hard mask layer is formed after the step of forming the conductive layer, the interlayer dielectric and the contact plug.

2. The method according to claim 1, wherein the conductive patterns comprise gate electrodes.

3. The method according to claim 1, wherein the step of forming the conductive patterns comprises: forming a second conductive layer which includes at least one of tungsten, a tungsten silicide and cobalt, or stacking a polysilicon layer and the second conductive layer.

4. The method according to claim 3, wherein the second conductive layer is formed to a thickness of 700~2,000 Å.

5. The method according to claim 1, wherein
the step of forming the conductive patterns comprises: forming a second conductive layer which includes at least one of tungsten, a tungsten silicide and cobalt, or stacking a polysilicon layer and the second conductive layer, and the first conductive layer is formed of a conductive material that has an etching selectivity different from that of the second conductive layer.

6. The method according to claim 5, wherein the first conductive layer comprises a polysilicon layer.

7. The method according to claim 1, wherein the step of etching the partial thickness of the conductive patterns is implemented such that an etched thickness of the conductive patterns is in the range of 400~1,000 Å.

8. The method according to claim 1, wherein the step of forming the hard mask layer is implemented until spaces, which are defined by the step of etching the partial thickness of the conductive patterns, are completely filled.

9. The method according to claim 1, wherein the hard mask layer comprises a nitride layer.

10. The method according to claim 1, wherein the interlayer dielectric and at least a portion of the conductive patterns exhibit an etching selectivity of at least 100:1.

11. A method for manufacturing a semiconductor device, comprising the steps of:

forming conductive patterns on a substrate which has a first region and a second region, wherein a conductive pattern in the second region has a line width greater than a conductive pattern in the first region;

forming a first interlayer dielectric between the conductive patterns;

defining first contact holes in the first interlayer dielectric to expose portions of the substrate between the conductive patterns in the first region;

forming a first conductive layer over surfaces of the conductive patterns such that the first conductive layer is formed within the first contact holes;

etching the surface of the first conductive layer to expose upper end surfaces of the conductive patterns so as to form contact plugs isolated in the respective contact holes;

etching a partial thickness of the conductive patterns so that the upper end surfaces of the conductive patterns are lower than an upper end surface of the first interlayer dielectric; and forming an insulation layer such that the insulation layer completely fills spaces which are defined by etching the partial thickness of the conductive patterns in the first region, and such that the insulation layer is formed along a surface topology in the second region.

12. The method according to claim 11, wherein the first region includes a cell region and the second region includes a peripheral region.

13. The method according to claim 11, wherein the conductive patterns comprise gate electrodes.

14. The method according to claim 11, wherein the step of forming the conductive patterns comprises: forming a second conductive layer which includes at least one of tungsten, a tungsten silicide and cobalt, or stacking a polysilicon layer and the second conductive layer.

15. The method according to claim 14, wherein the second conductive layer is formed to a thickness of 700~2,000 Å.

16. The method according to claim 11, wherein
the step of forming the conductive patterns comprises forming a second conductive layer which includes at least any one of tungsten, a tungsten silicide and cobalt, or stacking a polysilicon layer and the second conductive layer, and the first conductive layer is formed of a conductive material that has an etching selectivity different from that of the second conductive layer.

17. The method according to claim 16, wherein the first conductive layer comprises a polysilicon layer.

18. The method according to claim 11, wherein the step of etching the partial thickness of the conductive patterns is implemented such that an etched thickness of the conductive patterns is in the range of 400~1,000 Å.

19. The method according to claim 11, wherein the insulation layer comprises a nitride layer.

20. The method according to claim 11, wherein, after the step of forming the insulation layer, the method further comprises the steps of:

forming a second interlayer dielectric on the insulation layer;

patterning the second interlayer dielectric and the insulation layer in the first region and the second region to define a second contact hole which exposes any one of the first contact plugs of the first region, and to define a third contact hole which exposes the conductive pattern in the second region; and filling a conductive material in the second contact hole and the third contact hole to form second and third contact plugs.

* * * * *